(12) United States Patent
Na et al.

(10) Patent No.: US 9,680,973 B2
(45) Date of Patent: Jun. 13, 2017

(54) ELECTRONIC DEVICE CAPABLE OF NFC COMMUNICATION

(71) Applicant: ITM SEMICONDUCTOR CO., LTD., Chungcheongbuk-do (KR)

(72) Inventors: Hyeok Hwi Na, Chungcheongbuk-do (KR); Ho Seok Hwang, Gyeonggi-do (KR); Young Seok Kim, Chungcheongbuk-do (KE); Seong Beom Park, Gyeonggi-do (KR); Sang Hoon Ahn, Chungcheongbuk-do (KR); Sun Ho Kim, Gyeonggi-do (KR)

(73) Assignee: ITM SEMICONDUCTOR CO., LTD., Chungcheongbuk-Do (KR)

( * ) Notice: Subject to any disclaimer, the term of this patent is extended or adjusted under 35 U.S.C. 154(b) by 3 days.

(21) Appl. No.: 14/972,324

(22) Filed: Dec. 17, 2015

(65) Prior Publication Data
US 2016/0181705 A1 Jun. 23, 2016

(30) Foreign Application Priority Data
Dec. 18, 2014 (KR) .................. 10-2014-0183286

(51) Int. Cl.
*H04M 1/02* (2006.01)
*H01Q 1/38* (2006.01)
*H01Q 7/00* (2006.01)

(52) U.S. Cl.
CPC ............. *H04M 1/026* (2013.01); *H01Q 1/38* (2013.01); *H01Q 7/00* (2013.01); *H04M 2250/04* (2013.01)

(58) Field of Classification Search
CPC ..................................... H04M 1/026
USPC ............... 455/575.7; 230/114, 112, 158
See application file for complete search history.

(56) References Cited

U.S. PATENT DOCUMENTS

| 2012/0075148 A1* | 3/2012 | Cho .................. G06K 19/0723 343/702 |
| 2014/0287274 A1* | 9/2014 | Hwang ................... H01Q 1/22 429/7 |
| 2015/0021402 A1* | 1/2015 | Finn ................ G06K 19/07794 235/492 |
| 2016/0224975 A1* | 8/2016 | Na ....................... G06Q 20/352 |

FOREIGN PATENT DOCUMENTS

| KR | 101133054 | 4/2012 |
| KR | 1020130010505 A | 1/2013 |
| KR | 101244193 | 3/2013 |
| KR | 1020130039143 | 4/2013 |

* cited by examiner

*Primary Examiner* — Alejandro Rivero
*Assistant Examiner* — Angelica M Perez
(74) *Attorney, Agent, or Firm* — Mayer & Williams PC; Stuart H. Mayer

(57) ABSTRACT

Disclosed is an electronic device capable of near field communication (NFC) and of achieving high integration, size reduction, and good sensitivity. The electronic device includes an antenna chip provided inside a battery protection circuit package of a battery pack and having embedded an NFC antenna therein, and an extended antenna loop electrically connected to the antenna chip and provided outside the battery protection circuit package.

6 Claims, 16 Drawing Sheets

ELECTRONIC DEVICE CAPABLE OF NFC COMMUNICATION

CROSS-REFERENCE TO RELATED PATENT APPLICATION

This application claims the benefit of Korean Patent Application No. 10-2014-0183286, filed on Dec. 18, 2014, in the Korean Intellectual Property Office, the disclosure of which is incorporated herein in its entirety by reference.

BACKGROUND

1. Field

The present invention relates to a electronic device and, more particularly, to an electronic device capable of near field communication (NFC).

2. Description of the Related Art

Near field communication (NFC) is a technology according to the non-contact short range communication standard enabling radio communication between electronic devices with low power over a short distance less than 10 cm using a frequency of 13.56 MHz, and has been co-developed by NXP Semiconductors, Netherlands and Sony, Japan in 2002. The data rate of NFC per sec. is, for example, 106 Kbps, 212 Kbps, 424 Kbps, or 848 Kbps. NFC is highly secure due to proximity properties and an encryption technology thereof, and enables devices to recognize each other within 1/10 sec. without using a complicated pairing procedure. Particularly, NFC is a smartcard-type non-contact radio communication technology using radio-frequency identification (RFID). Compared to a smartcard, NFC is bidirectional, has a relatively large memory space, and is applicable to a broader range of services. As such, the NFC technology is employed in currently commercialized electronic devices such as smartphones and tablet PCs.

Meanwhile, a battery is used in electronic devices such as smartphones, tablet PCs, and laptop computers. As a battery most commonly used in mobile devices, a lithium ion battery is heated when overcharge or overcurrent occurs, and even has the risk of explosion as well as performance degradation if heating is continued and thus temperature thereof is increased. Accordingly, a typical battery includes a protection circuit apparatus for detecting and blocking overcharge, overdischarge, and overcurrent, or uses an external protection circuit structure for detecting overcharge, overdischarge, or heating and blocking operation of the battery.

Products in which an NFC antenna is coupled to the battery of the above-described electronic device are currently released. However, in this case, a process for coupling the NFC antenna to the battery is additionally required to increase a manufacturing cost, and additional pads are required for the coupling process to increase the size of the battery irrespective of charging.

SUMMARY

The present invention provides a electronic device capable of near field communication (NFC). However, the scope of the present invention is not limited thereto.

According to an aspect of the present invention, there is provided an electronic device capable of near field communication (NFC), the electronic device including an antenna chip provided inside a battery protection circuit package of a battery pack and having embedded an NFC antenna therein, and an extended antenna loop electrically connected to the antenna chip and provided outside the battery protection circuit package.

A length of the extended antenna loop may be set in such a manner that a ratio of a value of inductance generated by the extended antenna loop to a value of inductance generated by the antenna chip is equal to or greater than 13%.

The extended antenna loop may surround at least a part of an edge of the main board.

The extended antenna loop may be connected to a substrate of the battery protection circuit package, may extend to an outside of the battery protection circuit package, and may be provided to contact a side surface of the battery pack.

The battery protection circuit package may include a substrate for mounting the antenna chip thereon, the substrate may include a lead frame having a plurality of leads including first and second internal connection terminal leads individually provided at two edge sides and electrically connected to electrode terminals of a battery bare cell, external connection terminal leads provided between the first and second internal connection terminal leads and serving as a plurality of external connection terminals, and a mounting lead provided between the first and second internal connection terminal leads and used to mount thereon at least a part of a protection integrated circuit (IC), a field effect transistor (FET) chip, and the antenna chip, and the battery protection circuit package may further include an electrical connection member for electrically interconnecting at least any two selected from the group consisting of the antenna chip, the protection IC, the FET chip, and the leads, thereby configuring a battery protection circuit without using a printed circuit board (PCB). In this case, the extended antenna loop may be a part of the lead frame extending to an outside of the battery protection circuit package, and may be bent in a downward direction to be provided to contact a side surface of the battery pack.

BRIEF DESCRIPTION OF THE DRAWINGS

The above and other features and advantages of the present invention will become more apparent by describing in detail embodiments thereof with reference to the attached drawings in which.

DETAILED DESCRIPTION

Figure 1A:
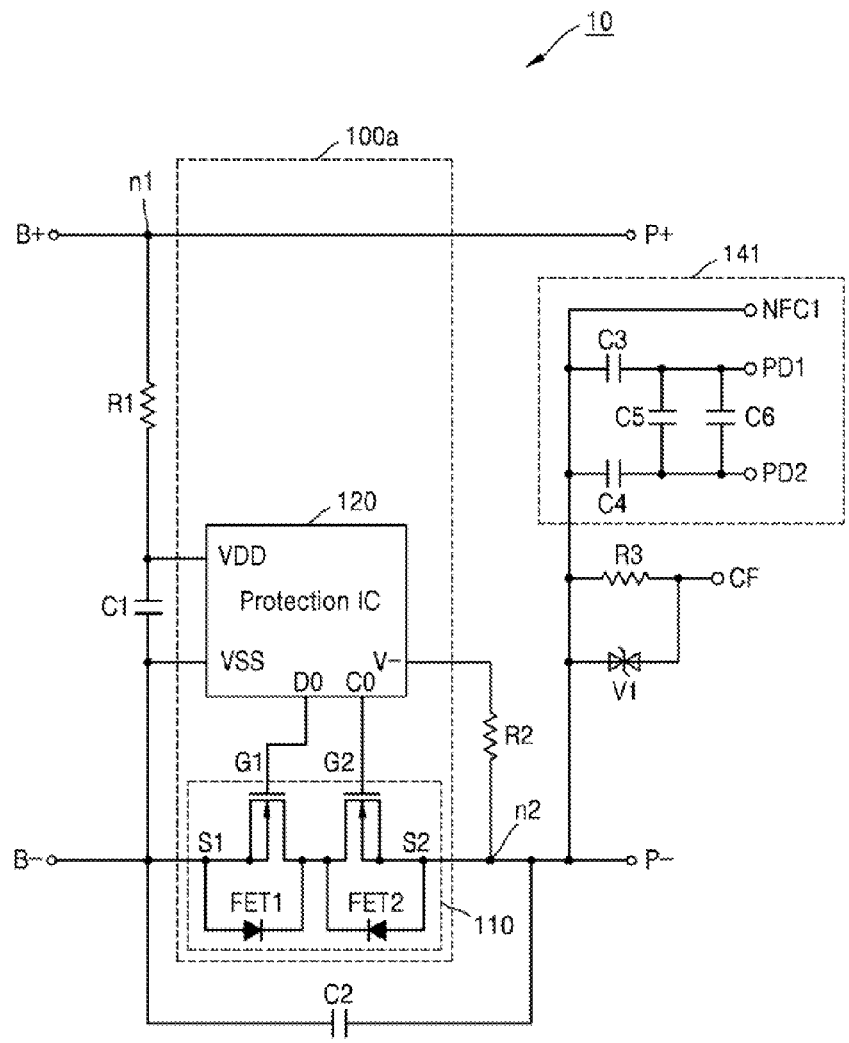
FIG. 1A is a circuit diagram of a battery protection circuit to be implemented using a battery protection circuit package, according to a comparative example of the present invention.

Hereinafter, the present invention will be described in detail by explaining embodiments of the invention with reference to the attached drawings.

The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art. In the drawings, the thicknesses of layers are exaggerated for clarity.

It will be understood that, although the terms first, second, third, etc., may be used herein to describe various elements, components, regions, layers and/or sections, these elements, components, regions, patterns, pads, layers and/or sections should not be limited by these terms. These terms are only used to distinguish one element, component, region, layer or section from another element, component, region, layer or section.

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Like reference numerals in the drawings denote like elements and repeated descriptions thereof will be omitted.

In embodiments of the present invention, a lead frame is an element in which lead terminals are patterned on a metal frame, and may differ from a printed circuit board (PCB) in which a metal wiring layer is provided on an insulating core, in terms of structures or thicknesses thereof.

An electronic device capable of near field communication (NFC) according to embodiments of the present invention may include, for example, a smartphone, a tablet PC, and a laptop computer, and the following description is focused on the smartphone as an example.

Figure 1B:
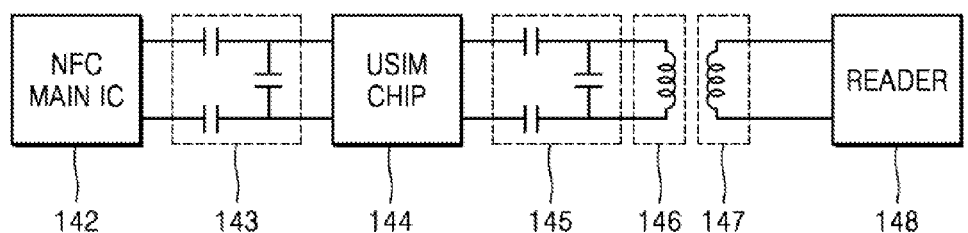
FIG. 1B is a diagram showing the configuration of general near field communication (NFC)
Figure 2:
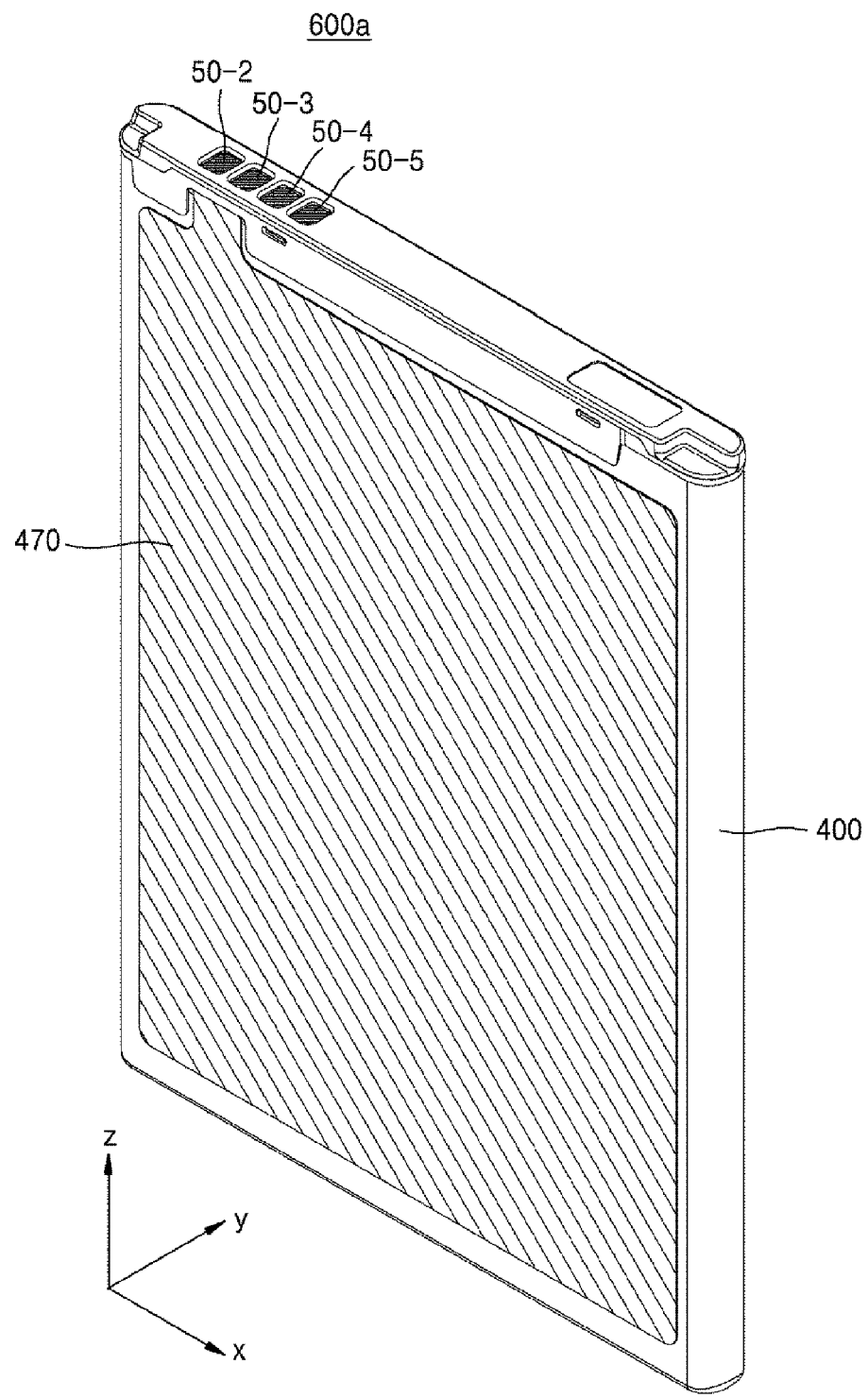
FIG. 2 is a perspective view of a battery pack including the battery protection circuit package, according to a comparative example of the present invention.
Figure 3:
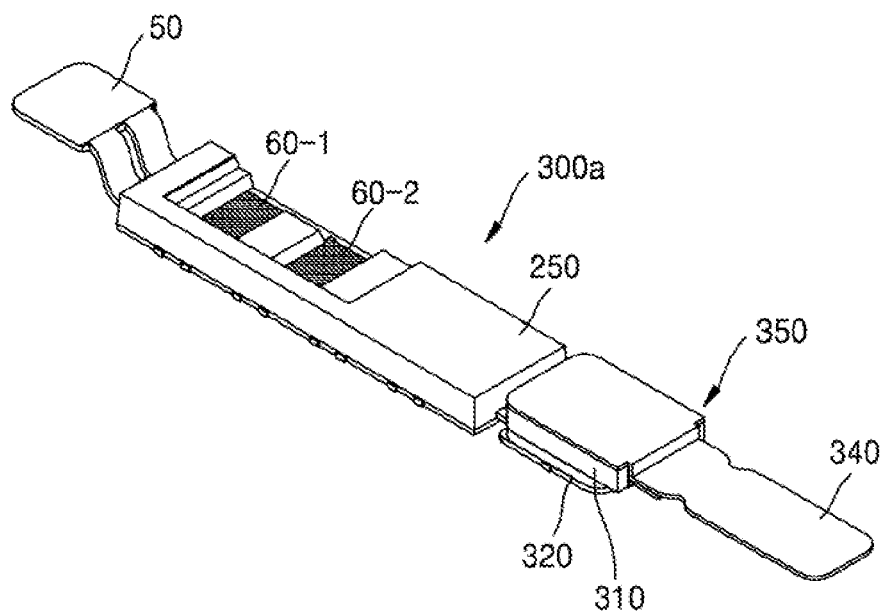
FIG. 3 is a perspective view of the battery protection circuit package according to a comparative example of the present invention.
Figure 4:
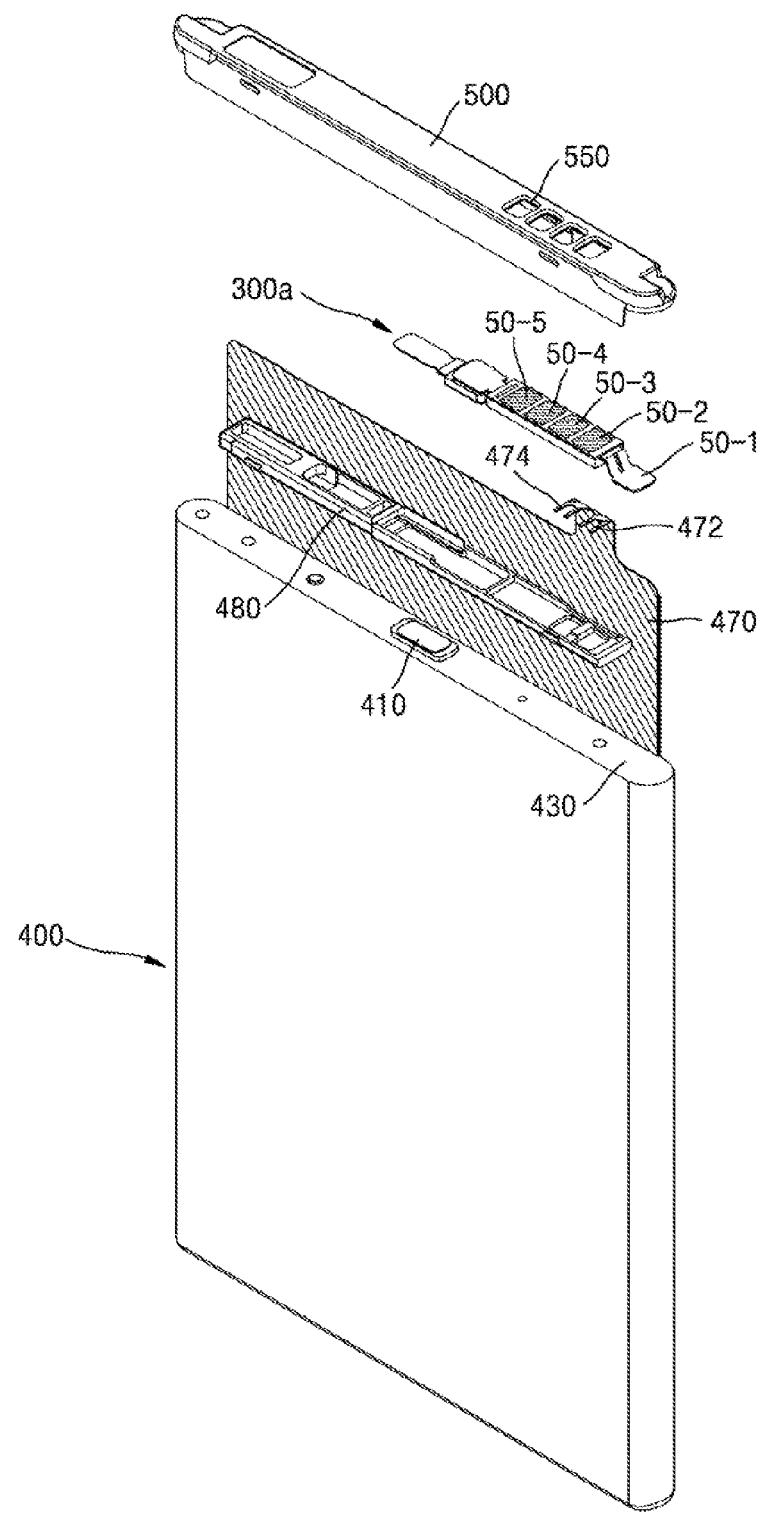
FIG. 4 is an exploded perspective view of the battery pack including the battery protection circuit package, according to a comparative example of the present invention.

FIG. 1A is a circuit diagram of a battery protection circuit 10 to be implemented using a battery protection circuit package, according to a comparative example of the present invention, and FIG. 1B is a diagram showing the configuration of general near field communication (NFC). FIG. 2 is a perspective view of a battery pack 600a including the battery protection circuit package, according to a comparative example of the present invention, FIG. 3 is a perspective view of the battery protection circuit package according to a comparative example of the present invention, and FIG. 4 is an exploded perspective view of the battery pack 600a including the battery protection circuit package, according to a comparative example of the present invention.

A battery protection circuit to be implemented using a battery protection circuit package of an electronic device according to an embodiment of the present invention may include the battery protection circuit 10 illustrated in FIG. 1A, except for a dashed part indicated by 141.

Referring to FIG. 1A, the battery protection circuit 10 includes first and second internal connection terminals B+ and B− to be connected to a battery cell, and first to third external connection terminals P+, CF, and P− to be connected to a charger for charging and to be connected to an electronic device (e.g., a mobile device) operating by battery power, for discharging. Herein, among the first to third external connection terminals P+, CF, and P−, the first and third external connection terminals P+ and P− are used to supply power and the other second external connection terminal CF is used to detect a battery type and perform charging appropriately for the battery type. In addition, the second external connection terminal CF may be provided as a thermistor for detecting battery temperature when charging, and may be used as a terminal having another function.

The battery protection circuit 10 may have a connection structure of a dual field effect transistor (FET) chip 110, a protection integrated circuit (IC) 120, resistors R1, R2, and R3, a varistor V1, and capacitors C1 and C2. The dual FET chip 110 includes first and second FETs FET1 and FET2 having a common drain. The protection IC 120 has a terminal (e.g., VDD) connected through the resistor R1 to the first internal connection terminal B+ serving as (+) terminal of the battery, applying a charge or discharge voltage through a first node n1, and detecting a battery voltage, a reference terminal (e.g., VSS) for providing a reference voltage of an internal operation voltage of the protection IC 120, a detection terminal (e.g., V−) for detecting charge/discharge and overcurrent states, a discharge off signal output terminal (e.g., DO) for switching off the first FET FET1 in overdischarge state, and a charge off signal output terminal (e.g., CO) for switching off the second FET FET2 in overcharge state.

Here, the protection IC 120 includes a reference voltage setter, a comparer for comparing a reference voltage and a charge/discharge voltage to each other, an overcurrent detector, and a charge/discharge detector. Herein, reference voltages for determining the charge and discharge states may be changed depending on specifications required by a user, and the charge and discharge states are determined based on the reference voltages by detecting the voltage difference between terminals of the protection IC 120.

The protection IC 120 is configured in such a manner that the terminal DO is changed to LOW state to switch off the first FET FET1 in overdischarge state, that the terminal CO is changed to LOW state to switch off the second FET FET2 in overcharge state, and that the second FET FET2 is switched off when charging and the first FET FET1 is switched off when discharging in overcurrent state.

The resistor R1 and the capacitor C1 stabilize variations in power supply of the protection IC 120. The resistor R1 is connected between the first node n1 serving as a power (V1) supply node of the battery, and the terminal VDD of the protection IC 120, and the capacitor C1 is connected between the terminal VDD and the terminal VSS of the protection IC 120.

The resistors R1 and R2 serve as a current limiter if a charger provides a high voltage exceeding absolute maximum ratings of the protection IC 120 or if the charger is connected with wrong polarity. The resistor R2 is connected between the terminal V− of the protection IC 120 and a second node n2 connected to a source terminal S2 of the second FET FET2.

The capacitor C2 is connected between the second node n2 (or the third external connection terminal P−) and a source terminal S1 of the first FET FET1 (or the terminal VSS or the second internal connection terminal B−). The capacitor C2 does not exert a strong influence on product features of the battery protection circuit 10, but is added upon a request of the user or for stability. The capacitor C2 is used to achieve system stabilization by improving tolerance to voltage variations or external noise.

The resistor R3 and the varistor V1 are elements for electrostatic discharge (ESD) and surge protection, and are connected in parallel to each other between the second external connection terminal CF and the second node n2 (or the third external connection terminal P−). The varistor V1 is an element for reducing resistance thereof when overvoltage occurs, and may minimize, for example, circuit damage due to overvoltage.

An NFC circuit 141 may be added to the above-described configuration of the battery protection circuit 10, thereby supporting NFC communication. The added NFC circuit 141 may include, for example, an NFC external connection terminal NFC1, NFC connection terminals PD1 and PD2, and NFC matching elements C3, C4, C5, and C6. For reference, the NFC connection terminals PD1 and PD2 illustrated in FIG. 1A are implemented as terminal pads 60-1 and 60-2 in a battery protection circuit package 300*a* illustrated in FIG. 3, and may contact ends 472 and 474 of an NFC antenna 470 (see FIG. 2) provided near the battery pack 600*a*. The NFC antenna 470 may be, for example, a loop-type antenna. If the ends 472 and 474 of the NFC antenna 470 contact the NFC connection terminals PD1 and PD2, the NFC matching elements C3, C4, C5, and C6 may be electrically connected to the NFC antenna 470 to form a closed loop. The NFC matching elements C3, C4, C5, and C6 may be, for example, capacitors for frequency matching. For example, the two ends 472 and 474 of the NFC antenna 470 may be connected to the NFC matching elements, e.g., capacitors, C3, C4, C5, and C6 to form a closed loop, and communication with an NFC device may be performed by generating a frequency region of 13.56 MHz for NFC communication using resonance generated from the NFC antenna 470 and the capacitors C3, C4, C5, and C6.

Referring to FIG. 1B, the configuration of general NFC communication includes an NFC main IC 142, a USIM chip 144, and a reader 148. First and second inductors 146 and 147 may be provided between the USIM chip 144 and the reader 148, and a first capacitor group 145 may be provided between the USIM chip 144 and the first inductor 146. A second capacitor group 143 may be provided between the NFC main IC 142 and the USIM chip 144.

The above-described NFC antenna 470 corresponds to the first inductor 146 illustrated in FIG. 1B, and the above-described capacitors C3, C4, C5, and C6 correspond to the first capacitor group 145 illustrated in FIG. 1B. The first inductor 146 and the first capacitor group 145 may be connected through the above-described NFC external connection terminal NFC1 to the NFC main IC 142, the second capacitor group 143, and the USIM chip 144.

Referring to FIGS. 2 to 4, in the battery protection circuit package and the battery pack 600*a* according to a comparative example of the present invention, the NFC antenna 470 is provided over a side surface of a battery bare cell 400 for configuring the battery pack 600*a*. The ends 472 and 474 of the NFC antenna 470 may be coupled to the terminal pads 60-1 and 60-2 of the battery protection circuit package 300*a* using, for example, a soldering process. However, since the terminal pads 60-1 and 60-2 are required for the antenna soldering process, the battery protection circuit package 300*a* may not easily achieve a small size and a sufficient internal space. Meanwhile, due to the antenna soldering process, a manufacturing process of the battery pack 600*a* may become complicated. In addition, since a coupling part between the NFC antenna 470 and the battery protection circuit package 300*a* is structurally weak, the shear strength of the whole structure may be low.

In a battery protection circuit package according to embodiments of the present invention, the above-described problems are solved by employing an antenna chip including an NFC antenna, and an antenna detection range is complemented by adding an extended antenna. A detailed description thereof is now given.

Figure 5:
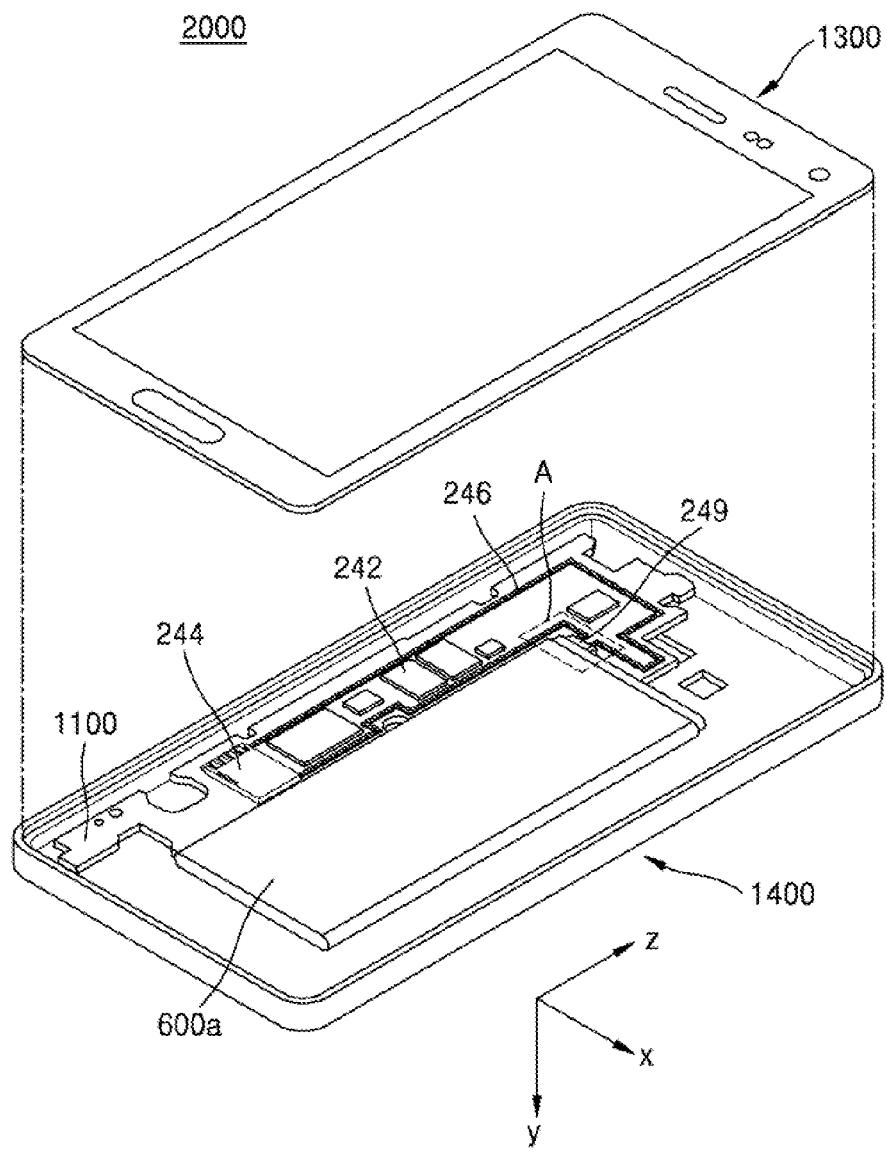
FIG. 5 is an exploded perspective view of an electronic device capable of NFC communication, according to an embodiment of the present invention.
Figure 6:
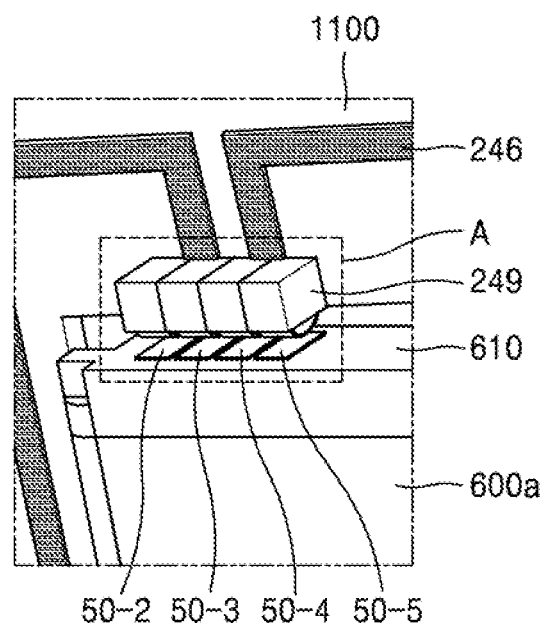
FIG. 6 is a magnified perspective view of part A of FIG. 5.

FIG. 5 is an exploded perspective view of an electronic device 2000 capable of NFC communication, according to an embodiment of the present invention, and FIG. 6 is a magnified perspective view of part A of FIG. 5.

Figure 7A:
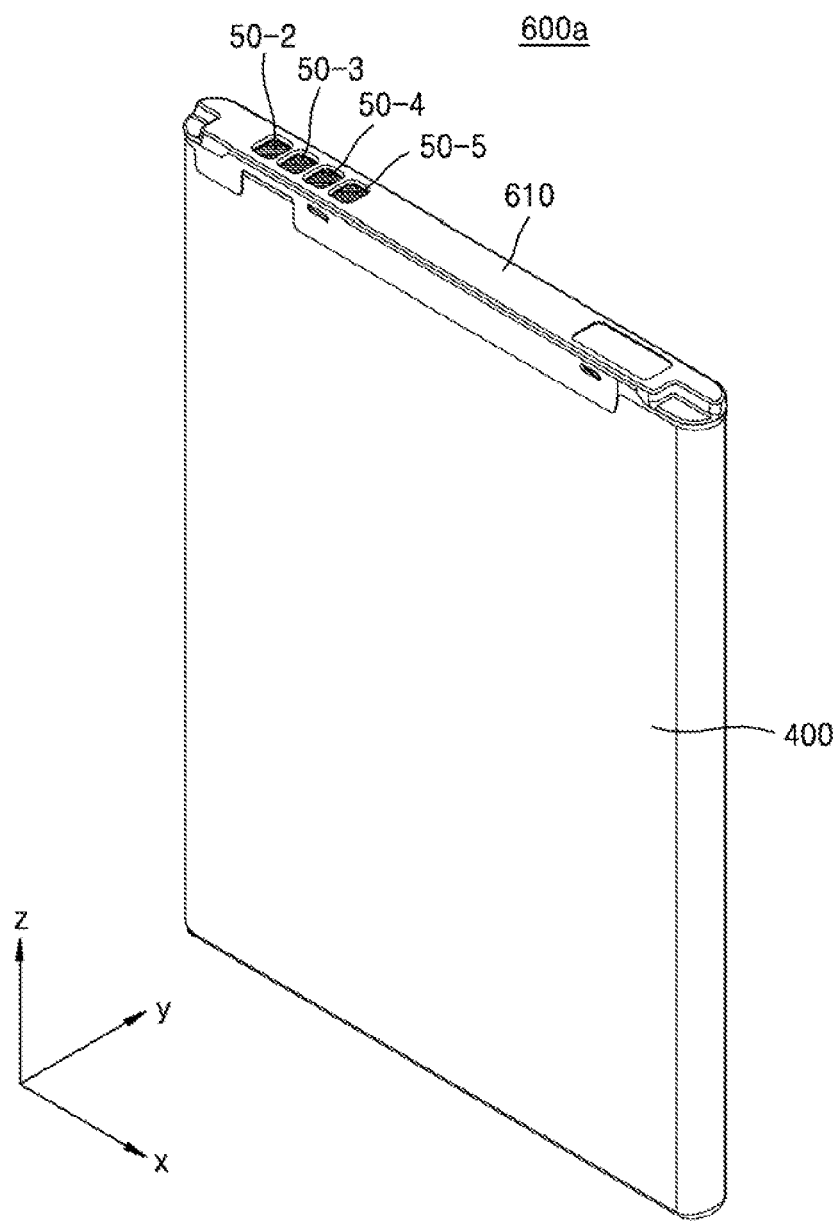
FIG. 7A is an assembled perspective view of a battery pack included in the electronic device, according to an embodiment of the present invention.
Figure 7B:
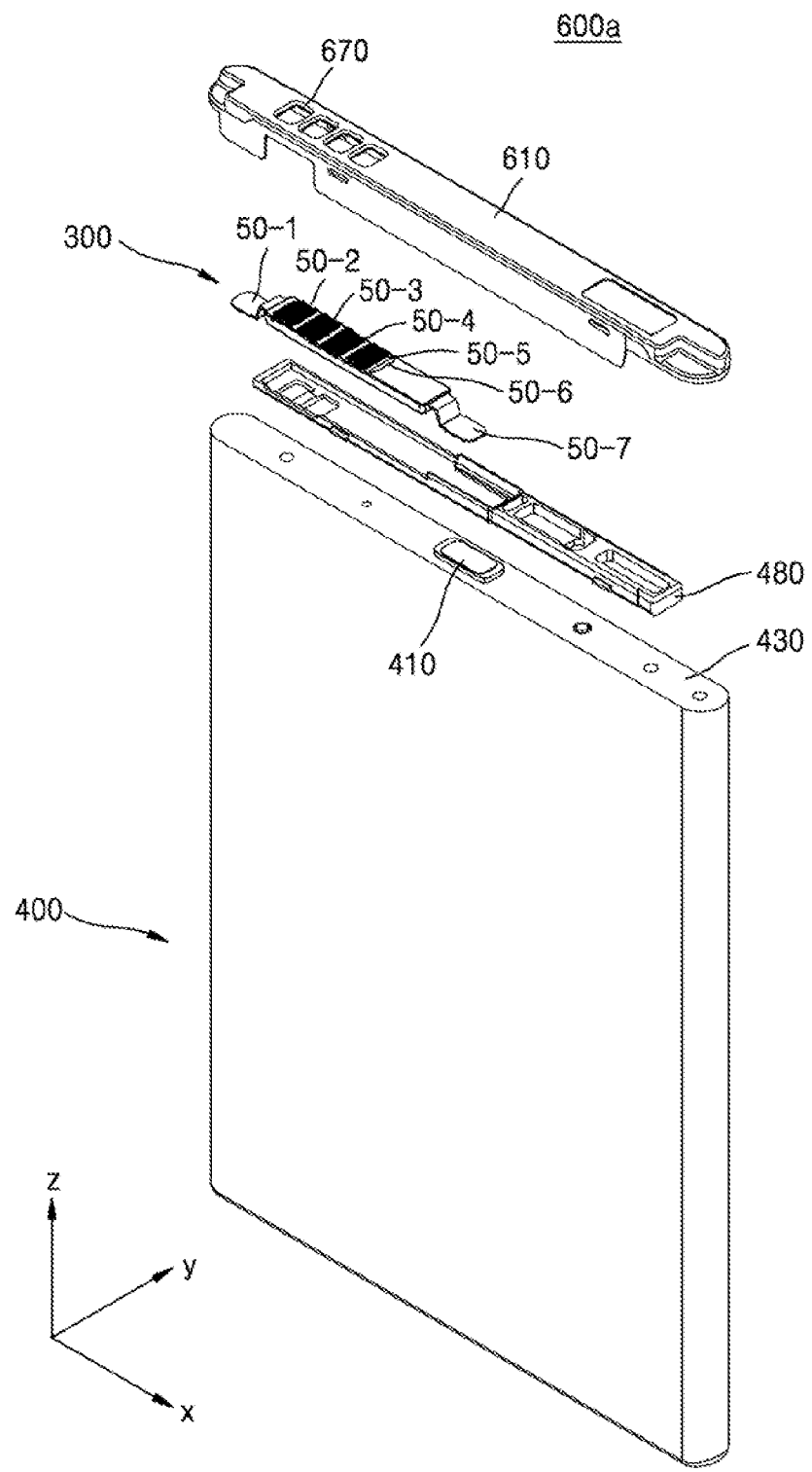
FIG. 7B is an exploded perspective view of the battery pack included in the electronic device, according to an embodiment of the present invention.
Figure 8A:
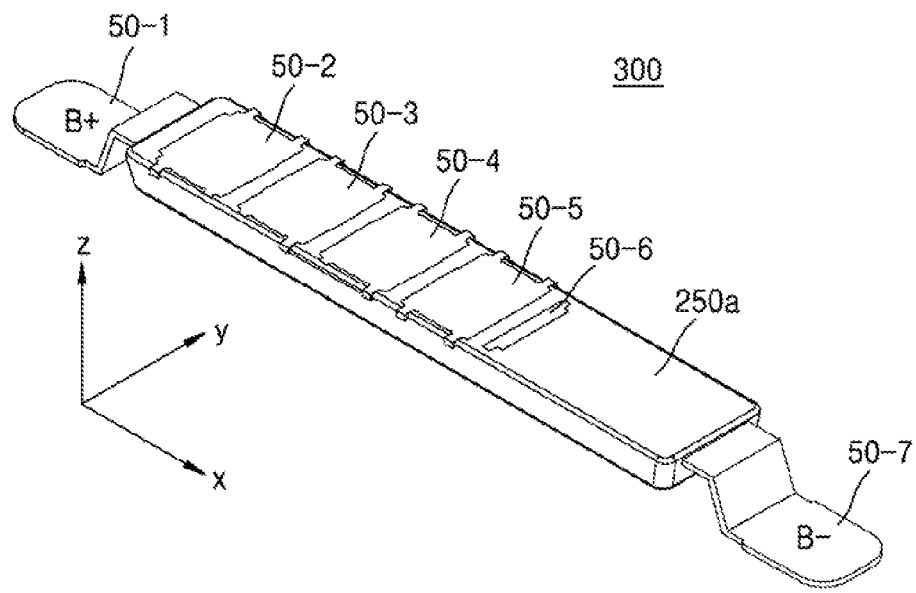
FIGS. 8A and 8B are perspective views of a battery protection circuit package included in the battery pack of the electronic device, according to an embodiment of the present invention.
Figure 8B:
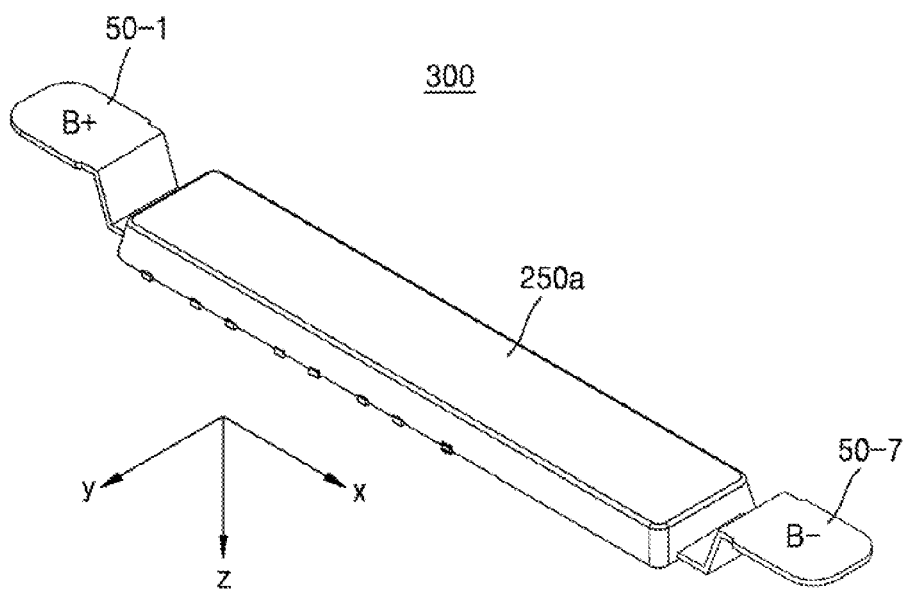

FIGS. 7A and 7B are an assembled perspective view and an exploded perspective view of a battery pack 600*a* included in the electronic device 2000, according to an embodiment of the present invention, and FIGS. 8A and 8B are perspective views of a battery protection circuit package 300 included in the battery pack 600*a* of the electronic device 2000, according to an embodiment of the present invention.

Figure 9:
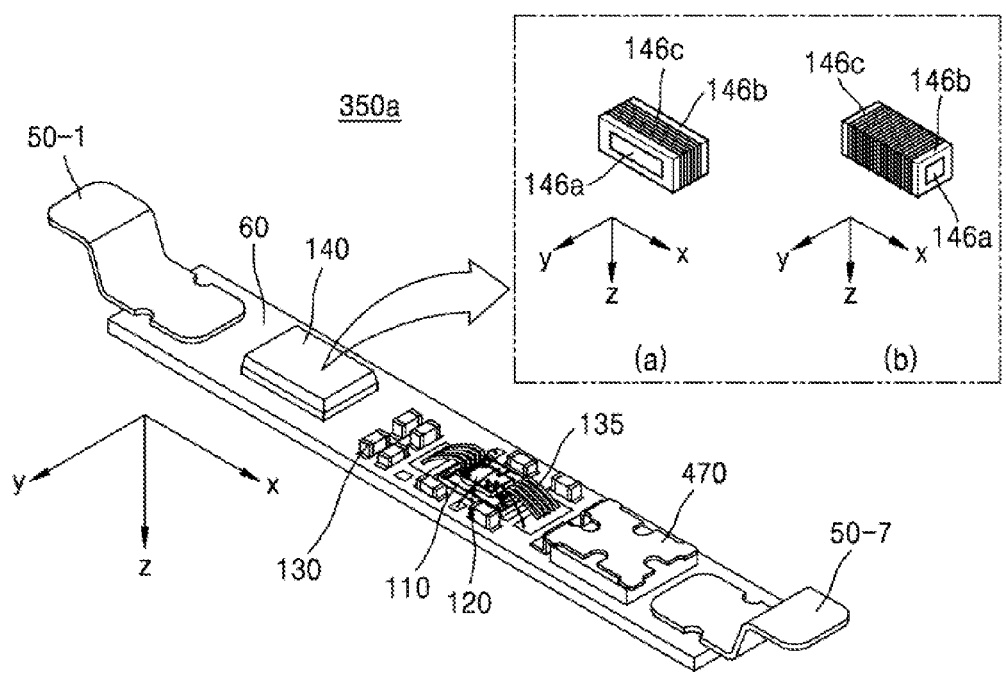
FIG. 9 is a perspective view showing a partial configuration of the battery protection circuit package included in the battery pack of the electronic device, according to an embodiment of the present invention.
Figure 10:
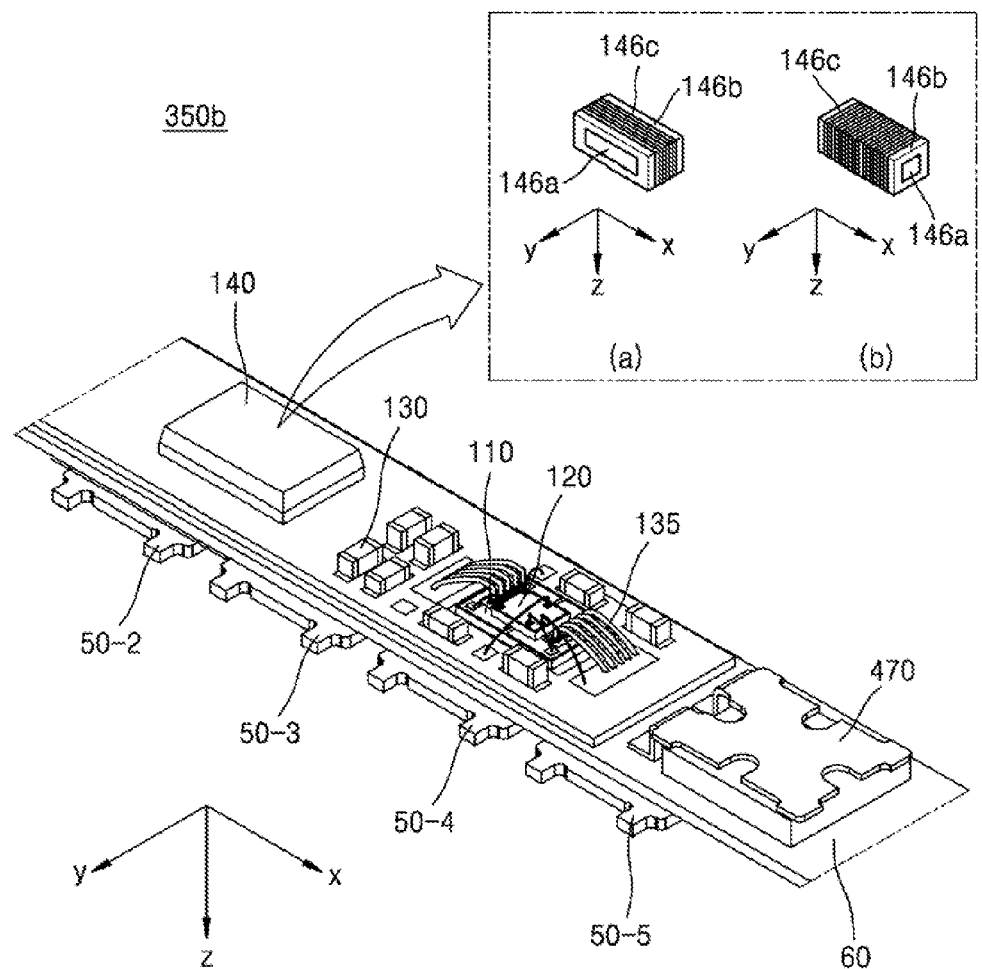
FIG. 10 is a perspective view showing another partial configuration of the battery protection circuit package included in the battery pack of the electronic device, according to an embodiment of the present invention.
Figure 11:
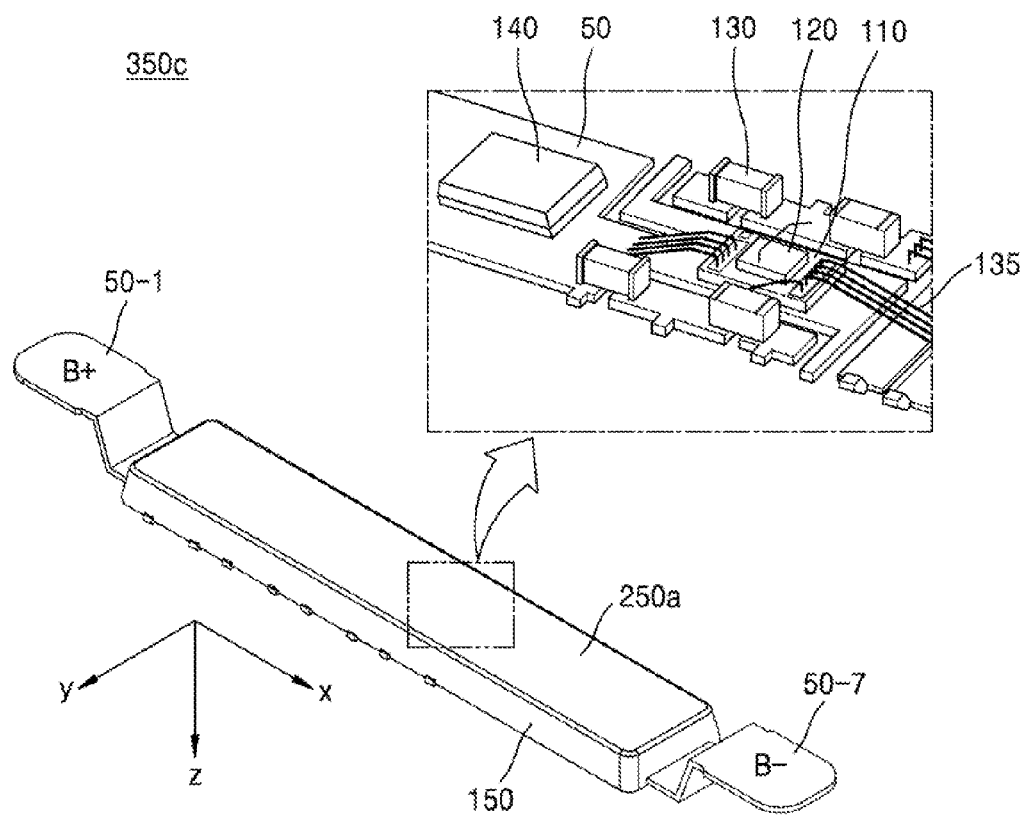
FIG. 11 is a perspective view showing still another partial configuration of the battery protection circuit package included in the battery pack of the electronic device, according to an embodiment of the present invention.

FIGS. 9 to 11 are perspective views showing various partial configurations of the battery protection circuit package 300 included in the battery pack 600*a* of the electronic device 2000, according to an embodiment of the present invention.

Referring to FIGS. 5 to 11, the electronic device 2000 according to an embodiment of the present invention includes an antenna chip 140 provided inside the battery protection circuit package 300 of the battery pack 600*a* and having embedded an NFC antenna therein; and an extended antenna loop 246 electrically connected to the antenna chip 140 and provided outside the battery protection circuit package 300. Specifically, for example, the extended antenna loop 246 is configured as a conductive line pattern for antenna provided on a main board 1100 of the electronic device 2000. For example, the extended antenna loop 246 may surround at least a part of the edge of the main board 1100.

Referring to FIGS. 5 and 6, in the electronic device 2000 according to an embodiment of the present invention, the main board 1100 refers to a substrate for mounting thereon electronic elements 242 capable of enabling fundamental operations of the electronic device 2000, and may also be called a main set, a main substrate, or the like. The essential electronic elements 242 mounted on the main board 1100 may include, for example, an application processor (AP), a camera module, a sensor module, a frequency filtering part, and a memory module.

As described above, the various electronic elements 242 for implementing the fundamental operations of the electronic device 2000 are provided on the main board 1100, and a wiring pattern (not shown) for electrically interconnecting the electronic elements 242 is also provided on the main board 1100. The conductive line pattern for configuring the extended antenna 246 may be provided on the main board 1100 separately from the above-described wiring pattern for electrically interconnecting the electronic elements 242.

Meanwhile, a socket 244 for mounting a USIM chip (see 144 of FIG. 1B) therein may be provided on the main board 1100. In addition, NFC matching elements (see 143 and 145 of FIG. 1B) may be provided on the main board 1100. The extended antenna 246 is configured to interconnect the battery pack 600a and the socket 244, and may be provided to surround at least a part of the edge of the main board 1100 to maximize the area of an internal region defined by the extended antenna 246.

Referring to FIG. 6, the extended antenna loop 246 provided on the main board 1100 is electrically connected through connection terminals 249 to at least a part of external connection terminals 50-2, 50-3, 50-4, and 50-5 of the battery pack 600a (e.g., terminals NFC and CF). The external connection terminals 50-2, 50-3, 50-4, and 50-5 correspond to external connection terminals of the battery protection circuit package 300 for configuring the battery pack 600a.

To describe the configuration of the antenna chip 140 in detail, a description is first given of the battery pack 600a and the battery protection circuit package 300.

Referring to FIGS. 7A and 7B, the battery bare cell 400 for configuring the battery pack 600a includes an electrode assembly and a cap assembly. The electrode assembly may include a positive plate produced by coating a positive active material on a positive current collector, a negative plate produced by coating a negative active material on a negative current collector, and a separator intervened between the positive and negative plates to prevent a short circuit and allow motion of lithium ions between the positive and negative plates. A positive tap coupled to the positive plate and a negative tap coupled to the negative plate may protrude from the electrode assembly. The cap assembly includes a negative terminal 410, a cap plate 430, etc. The cap plate 430 may serve as a positive terminal. The negative terminal 410 may also be called a negative cell or an electrode cell. Accordingly, electrode terminals of the battery bare cell 400 may include the negative terminal 410 and the cap plate 430. A holder 480 may serve as a guide capable of aligning and mounting the battery protection circuit package 300 with and on a top surface 430 of the battery bare cell 400, and may also serve as a fixer for fixing the battery protection circuit package 300 on the top surface 430 of the battery bare cell 400.

A structure 350a illustrated in FIG. 9 shows a partial configuration of the battery protection circuit package 300 embedded in the battery pack 600a, and the battery protection circuit package 300 may be implemented by providing an encapsulant 250a on the structure 350a. A substrate 60 for configuring the battery protection circuit package 300 may be, for example, a printed circuit board (PCB). Leads 50-1 and 50-7 may be provided on two ends of the substrate 60. The external connection terminals 50-2, 50-3, 50-4, and 50-5 of the battery protection circuit package 300 may be configured as pads provided on a bottom surface of the substrate 60. An FET chip 110 and a protection IC 120 may be mounted on the substrate 60, and passive elements 130 such as resistors R1, R2, and R3, a varistor V1, and capacitors C1 and C2 may also be mounted on the substrate 60. A PTC element 470 may be optionally mounted on the substrate 60.

The antenna chip 140 is mounted on the substrate 60. The antenna chip 140 is an antenna capable of resonating in an NFC frequency band, and includes a chip-type structure embedding an inductor therein. A coil for configuring the inductor embedded in the antenna chip 140 may have one of the following wire-winding structures and/or various combinations thereof.

A wire-winding structure illustrated in FIG. 9(*a*) includes a coil having a first winding direction. For example, the above wire-winding structure includes a coil 146c having a first winding direction parallel to the x direction and the z direction to surround a core 146a formed of nickel ferrite, and a bobbin 146b. In this case, the direction of an induced magnetic field generated in association with the NFC reader 148 is parallel to the y direction. In this wire-winding structure, NFC communication may be implemented when wider side surfaces of the battery pack 600a are located in parallel to the NFC reader 148.

A wire-winding structure illustrated in FIG. 9(*b*) includes a coil having a second winding direction. For example, the above wire-winding structure includes a coil 146c having a second winding direction parallel to the y direction and the z direction to surround a core 146a formed of nickel ferrite, and a bobbin 146b. In this case, the direction of an induced magnetic field generated in association with the NFC reader 148 is parallel to the x direction. In this wire-winding structure, NFC communication may be implemented when narrower side surfaces of the battery pack 600a are located in parallel to the NFC reader 148.

The wire-winding structure of the antenna chip 140 has been described above as, for example, a coiling structure for winding a coil around a core. However, the inductor included in the antenna chip 140 according to the technical idea of the present invention is not limited to the above coiling structure and may also be implemented by, for example, patterning a conductive material.

A structure 350b illustrated in FIG. 10 shows a modified partial configuration of the battery protection circuit package 300 embedded in the battery pack 600a, and the battery protection circuit package 300 may be implemented by providing an encapsulant 250a on the structure 350b.

A substrate for configuring the battery protection circuit package 300 may include a lead frame including a plurality of leads 50-2, 50-3, 50-4, and 50-5, and a PCB 60 provided on the lead frame. The external connection terminals 50-2, 50-3, 50-4, and 50-5 of the battery protection circuit package 300 may correspond to a part of a plurality of leads included in the lead frame. The antenna chip 140 may be mounted on the PCB 60 of the substrate, and a wire-winding structure or the like is described above in relation to FIG. 9 and thus is not described herein to avoid redundancy.

A structure 350c illustrated in FIG. 11 shows a modified partial configuration of the battery protection circuit package 300 embedded in the battery pack 600a, and the battery protection circuit package 300 may be implemented by providing an encapsulant 250a on the structure 350c.

A substrate 50 for configuring the battery protection circuit package 300 may include only a lead frame. That is, the substrate 50 may include only a lead frame having a plurality of leads including first and second internal connection terminal leads 50-1 and 50-7 individually provided at two edge sides and electrically connected to electrode terminals of a battery bare cell, external connection terminal leads 50-2, 50-3, 50-4, and 50-5 provided between the first and second internal connection terminal leads 50-1 and 50-7 and serving as a plurality of external connection terminals, and a mounting lead provided between the first and second internal connection terminal leads 50-1 and 50-7 and used to mount thereon at least a part of the protection IC 120, the FET chip 110, and the antenna chip 140. Meanwhile, the battery protection circuit package 300 may further include an electrical connection member 135 for electrically interconnecting at least any two selected from the group consisting of the antenna chip 140, the protection IC 120, the FET chip 110, and the leads, thereby configuring a battery protection circuit without using a PCB.

The antenna chip 140 may be mounted on the lead frame 50 serving as the substrate, and a wire-winding structure or the like is described above in relation to FIG. 9 and thus is not described herein to avoid redundancy.

The antenna chip 140 illustrated in FIGS. 9 to 11 has a small size and thus antenna sensitivity thereof may be low. The extended antenna 246 connected to the antenna chip 140 to compensate for the low sensitivity may be understood as an additional antenna provided separately from the antenna chip 140.

The extended antenna 246 has a shape capable of generating inductance, for example, a shape of at least a part of a loop capable of generating inductance. Inductance refers to an amount indicating the ratio of a counter electromotive force generated by induction of an electromotive force due to a variation in current flowing through a circuit, and the measurement unit for inductance is H (henry). In this specification, the loop has an arbitrary shape capable of generating inductance. In addition, the loop is not limited to a closed loop.

The inventors discovered that, to allow the extended antenna 246 configured as a conductive pattern to serve as an auxiliary antenna, an inductance value generated by the extended antenna 246 should be equal to or greater than a predetermined ratio compared to the inductance value generated by the antenna chip 140.

Table 1 shows a result of testing whether the extended antenna 246 functions as an NFC auxiliary antenna, based on the inductance value generated by the extended antenna 246 when the inductance value generated by the antenna chip 140 is 0.56 μH.

TABLE 1

| Experimental Examples | Inductance of Extended Antenna (μH) | Length of Extended Antenna (mm) | Inductance Ratio | Capability to Function as NFC Auxiliary Antenna |
|---|---|---|---|---|
| Experimental Example 1 | 0.04 | 34 | 6% | x |
| Experimental Example 2 | 0.05 | 37 | 8% | x |
| Experimental Example 3 | 0.07 | 43 | 11% | x |
| Experimental Example 4 | 0.08 | 47 | 13% | o |
| Experimental Example 5 | 0.09 | 50 | 14% | o |

Referring to Experimental Example 1, when the length of the extended antenna 246 forming a loop is 34 mm, the inductance value generated by the extended antenna 246 is 0.04 μH but the extended antenna 246 does not function as an NFC auxiliary antenna. That is, when the inductance value generated by the extended antenna 246 is only 6% of the inductance value generated by the antenna chip 140, although the extended antenna 246 configured as a conductive line pattern for antenna is employed, an NFC readable distance is not increased.

On the contrary, referring to Experimental Example 4, when the length of the extended antenna 246 forming a loop is 47 mm, the inductance value generated by the extended antenna 246 is 0.08 μH and the extended antenna 246 functions as an NFC auxiliary antenna. That is, when the inductance value generated by the extended antenna 246 reaches 13% of the inductance value generated by the antenna chip 140, an NFC readable distance is increased due to the extended antenna 246 configured as a conductive line pattern for antenna.

As shown in Experimental Examples 1 to 5, by ensuring a predetermined or longer length of the extended antenna 246 configured as a conductive line pattern for antenna, when the ratio of the value of inductance generated by the extended antenna 246 to the value of inductance generated by the antenna chip 140 is equal to or greater than a predetermined ratio (e.g., 13%), an NFC readable distance is increased due to the extended antenna 246 configured as a conductive line pattern for antenna.

Figure 12:
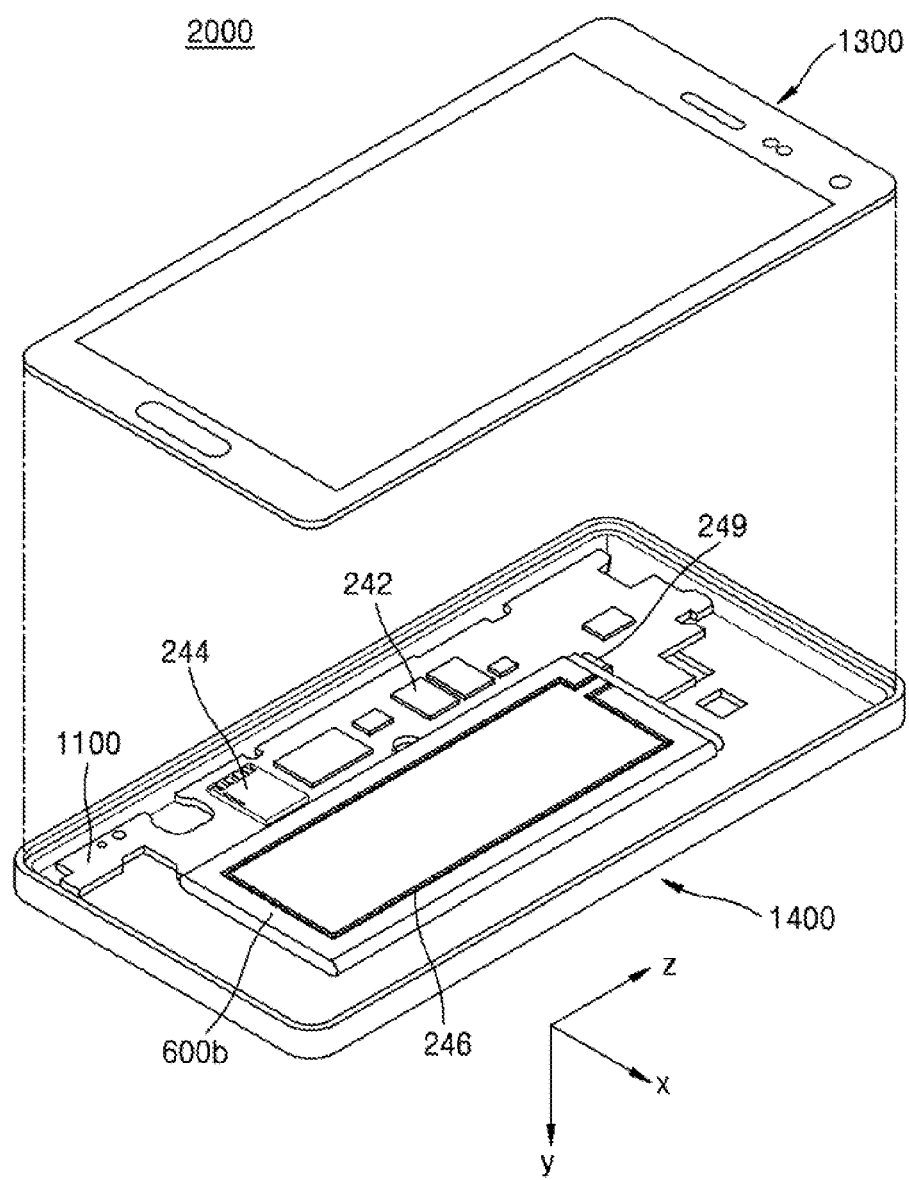
FIG. 12 is an exploded perspective view of an electronic device capable of NFC communication, according to another embodiment of the present invention.
Figure 13:
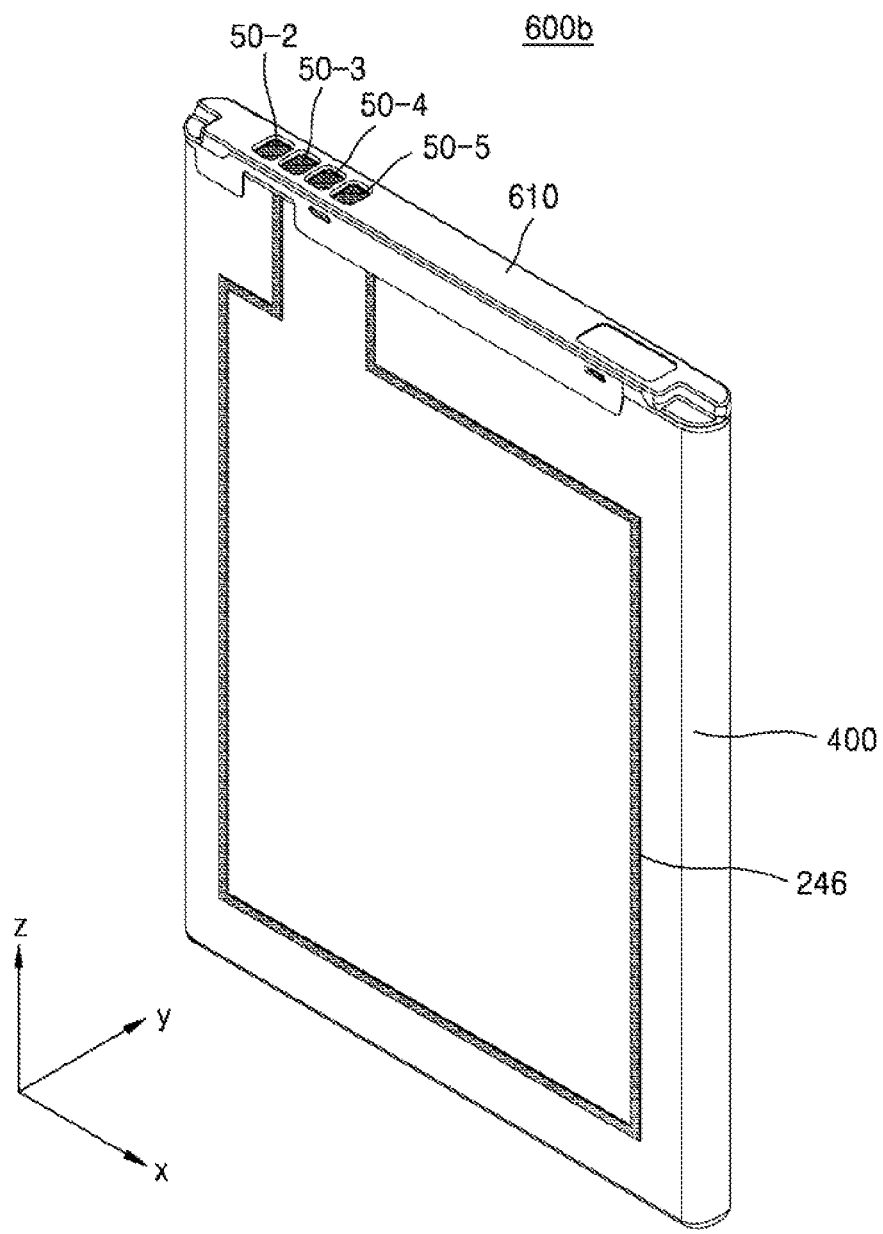
FIG. 13 is a perspective view of a battery pack included in the electronic device, according to another embodiment of the present invention.
Figure 14:
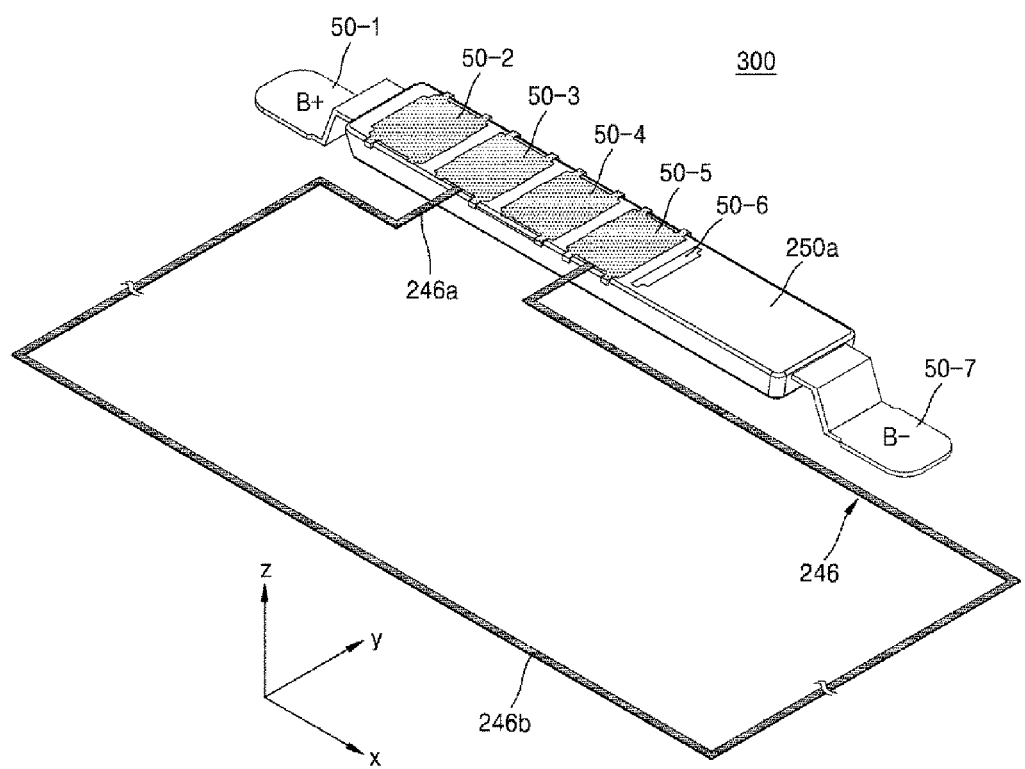
FIG. 14 is a perspective view of a battery protection circuit package included in the battery pack of the electronic device, according to another embodiment of the present invention.

FIG. 12 is an exploded perspective view of an electronic device 2000 capable of NFC communication, according to another embodiment of the present invention, FIG. 13 is a perspective view of a battery pack 600b included in the electronic device 2000, according to another embodiment of the present invention, and FIG. 14 is a perspective view of a battery protection circuit package 300 included in the battery pack 600b of the electronic device 2000, according to another embodiment of the present invention.

The battery protection circuit package 300 illustrated in FIG. 14 may be implemented by providing an encapsulant 250a on the structure 350b illustrated in FIG. 10 or the structure 350c illustrated in FIG. 11, except for an extended antenna loop 246. The extended antenna loop 246 corresponds to a part of a lead frame 50, and extends to the outside of the battery protection circuit package 300. For example, one end of the extended antenna loop 246 may be integrated with an external connection terminal lead 50-3 of the lead frame 50 and extend to the outside, and another end of the extended antenna loop 246 may be integrated with an external connection terminal lead 50-5 of the lead frame 50 and extend to the outside. The extended antenna loop 246 may include a first part 246a bendable in a downward direction (e.g., the −z direction) and a second part 246b forming a rectangular loop. By bending the first part 246a in the downward direction, the extended antenna loop 246 may be provided to contact a side surface of the battery pack 600b. Optionally, an adhesive material may be intervened between the extended antenna loop 246 and the side surface of the battery pack 600b. According to this configuration, the extended antenna loop 246 may be implemented without using soldering which is required by the configuration of FIG. 4. In addition, due to integration with the lead frame 50, the structural strength of a coupling part may be increased.

Figure 15:
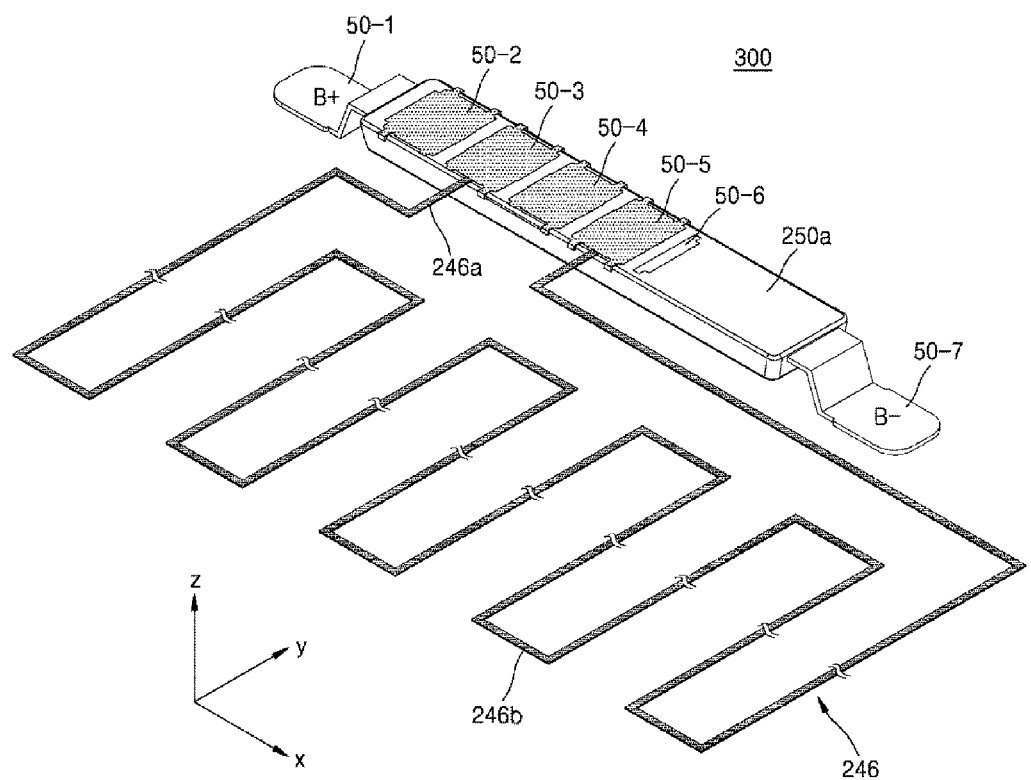
FIG. 15 is a perspective view showing a modified configuration of the battery protection circuit package included in the battery pack of the electronic device, according to another embodiment of the present invention.

FIG. 15 is a perspective view showing a modified configuration of the battery protection circuit package 300 included in the battery pack 600b of the electronic device 2000, according to another embodiment of the present invention. Since the second part 246b of the extended antenna loop 246 illustrated in FIG. 15 has multiple turns, an inductance value generated by the extended antenna loop 246 may be improved. Other descriptions of the extended antenna loop 246 are the same as those given above in relation FIG. 14 and thus are not given herein to avoid redundancy.

According to embodiments of the present invention, an electronic device capable of NFC communication and of achieving high integration, size reduction, and good sensitivity may be provided. However, the scope of the present invention is not limited to the above-described effect.

While the present invention has been particularly shown and described with reference to embodiments thereof, it will be understood by those of ordinary skill in the art that various changes in form and details may be made therein without departing from the spirit and scope of the present invention as defined by the following claims.

What is claimed is:

1. An electronic device capable of near field communication (NFC), the electronic device comprising:
   an antenna chip that is provided inside a battery protection circuit package of a battery pack and in which an NFC antenna is disposed;
   an extended antenna loop electrically connected to the antenna chip and provided outside the battery protection circuit package; and
   wherein the battery protection circuit package comprises a substrate for mounting the antenna chip thereon,
   wherein the substrate comprises a lead frame having a plurality of leads comprising:
   first and second internal connection terminal leads individually provided at two edge sides and electrically connected to electrode terminals of a battery bare cell;
   external connection terminal leads provided between the first and second internal connection terminal leads and serving as a plurality of external connection terminals;
   and a mounting lead provided between the first and second internal connection terminal leads and used to mount thereon at least a part of a protection integrated circuit (IC), a field effect transistor (FET) chip, and the antenna chip, and
   wherein the battery protection circuit package further comprises an electrical connection member for electrically interconnecting at least any two selected from the group consisting of the antenna chip, the protection IC, the FET chip, and the leads, thereby configuring a battery protection circuit without using a printed circuit board (PCB).

2. The electronic device of claim 1, wherein a length of the extended antenna loop is set in such a manner that a ratio of a value of inductance generated by the extended antenna loop to a value of inductance generated by the antenna chip is equal to or greater than 13%.

3. The electronic device of claim 1, wherein the extended antenna loop is configured as a conductive line pattern for antenna provided on a main board of the electronic device.

4. The electronic device of claim 3, wherein the extended antenna loop surrounds at least a part of an edge of the main board.

5. The electronic device of claim 1, wherein the extended antenna loop is connected to a substrate of the battery protection circuit package, extends to an outside of the battery protection circuit package, and is provided to contact a side surface of the battery pack.

6. The electronic device of claim 1, wherein the extended antenna loop is a part of the lead frame extending to an outside of the battery protection circuit package, and is bent in a downward direction to be provided to contact a side surface of the battery pack.

* * * * *